(12) United States Patent
Ervin et al.

(10) Patent No.: US 9,484,269 B2
(45) Date of Patent: Nov. 1, 2016

(54) STRUCTURE AND METHOD TO CONTROL BOTTOM CORNER THRESHOLD IN AN SOI DEVICE

(75) Inventors: Joseph Ervin, Wappingers Falls, NY (US); Jeffrey B. Johnson, Essex Junction, VT (US); Kevin McStay, Hopewell Junction, NY (US); Paul C. Parries, Wappingers Falls, NY (US); Chengwen Pei, Danbury, CT (US); Geng Wang, Stormville, NY (US); Yanli Zhang, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 898 days.

(21) Appl. No.: 12/822,492

(22) Filed: Jun. 24, 2010

(65) Prior Publication Data

US 2011/0316061 A1    Dec. 29, 2011

(51) Int. Cl.
*H01L 27/12* (2006.01)
*H01L 21/8242* (2006.01)
*H01L 21/84* (2006.01)
*H01L 21/762* (2006.01)
*H01L 27/108* (2006.01)

(52) U.S. Cl.
CPC ......... *H01L 21/84* (2013.01); *H01L 21/76237* (2013.01); *H01L 27/10847* (2013.01); *H01L 27/1203* (2013.01)

(58) Field of Classification Search
CPC ............. H01L 21/76237; H01L 21/84; H01L 27/1203; H01L 27/10847
USPC ...................... 438/249; 257/68, 71, E27.084
See application file for complete search history.

(56) References Cited

U.S. PATENT DOCUMENTS

| | | | |
|---|---|---|---|
| 4,999,312 A * | 3/1991 | Yoon .............................. | 438/392 |
| 5,053,345 A | 10/1991 | Schnable et al. | |
| 5,346,839 A | 9/1994 | Sundaresan | |
| 5,753,530 A | 5/1998 | Akamine et al. | |
| 5,953,607 A * | 9/1999 | Hakey et al. ................. | 438/249 |
| 6,323,082 B1 * | 11/2001 | Furukawa et al. ............ | 438/247 |
| 6,344,390 B1 * | 2/2002 | Bostelmann et al. ........ | 438/249 |
| 6,426,252 B1 * | 7/2002 | Radens et al. ................ | 438/243 |
| 6,486,024 B1 * | 11/2002 | Tews et al. .................... | 438/249 |
| 6,566,177 B1 * | 5/2003 | Radens et al. ................ | 438/152 |
| 6,579,759 B1 * | 6/2003 | Chudzik et al. .............. | 438/249 |
| 6,638,815 B1 * | 10/2003 | Bronner et al. .............. | 438/246 |
| 6,740,920 B2 * | 5/2004 | Chidambarrao .. H01L 21/26586 257/302 |  |
| 6,762,099 B1 * | 7/2004 | Yu-Sheng et al. ............ | 438/270 |
| 6,969,648 B2 * | 11/2005 | Cheng et al. ................. | 438/249 |
| 7,232,718 B2 * | 6/2007 | Chang et al. ................. | 438/243 |
| 7,294,543 B2 * | 11/2007 | Cheng et al. ................. | 438/243 |
| 7,491,995 B2 | 2/2009 | Forbes | |
| 7,759,188 B2 * | 7/2010 | Cheng et al. ................. | 438/243 |
| 7,803,701 B2 * | 9/2010 | Lin et al. ...................... | 438/525 |
| 7,898,014 B2 * | 3/2011 | Cheng et al. ................. | 257/302 |
| 2002/0022326 A1 * | 2/2002 | Kunikiyo ...................... | 438/296 |

(Continued)

*Primary Examiner* — William F Kraig
*Assistant Examiner* — Maliheh Malek
(74) *Attorney, Agent, or Firm* — David Cain; Andrew M. Calderon; Roberts Mlotkowski Safran Cole & Calderon, P.C.

(57) ABSTRACT

Semiconductor structures and methods to control bottom corner threshold in a silicon-on-insulator (SOI) device. A method includes doping a corner region of a semiconductor-on-insulator (SOI) island. The doping includes tailoring a localized doping of the corner region to reduce capacitive coupling of the SOI island with an adjacent structure.

6 Claims, 8 Drawing Sheets

(56) References Cited

U.S. PATENT DOCUMENTS

| | | |
|---|---|---|
| 2002/0179997 A1 | 12/2002 | Goth et al. |
| 2003/0013259 A1* | 1/2003 | Chidambarrao et al. ..... 438/301 |
| 2003/0168687 A1* | 9/2003 | Chidambarrao .. H01L 21/26586 257/300 |
| 2003/0203587 A1* | 10/2003 | Gluschenkov et al. ...... 438/392 |
| 2005/0009268 A1* | 1/2005 | Cheng et al. ................. 438/249 |
| 2005/0037566 A1* | 2/2005 | Tsai et al. .................... 438/249 |
| 2005/0037567 A1* | 2/2005 | Tsai et al. .................... 438/249 |
| 2005/0059207 A1* | 3/2005 | Chang et al. ................. 438/249 |
| 2006/0175660 A1* | 8/2006 | Cheng et al. ................. 257/347 |
| 2006/0267134 A1 | 11/2006 | Tilke et al. |
| 2007/0054432 A1* | 3/2007 | Moll .............................. 438/42 |
| 2008/0102569 A1* | 5/2008 | Cheng et al. ................. 438/156 |
| 2008/0124863 A1* | 5/2008 | Cheng et al. ................. 438/243 |
| 2009/0173980 A1* | 7/2009 | Cheng et al. ................. 257/301 |
| 2011/0081757 A1* | 4/2011 | Juengling .................... 438/270 |
| 2011/0291169 A1* | 12/2011 | Ervin et al. .................. 257/300 |
| 2012/0104547 A1* | 5/2012 | Ervin et al. .................. 257/532 |
| 2012/0211814 A1* | 8/2012 | Cheng .......................... 257/301 |

\* cited by examiner

STRUCTURE AND METHOD TO CONTROL BOTTOM CORNER THRESHOLD IN AN SOI DEVICE

FIELD OF THE INVENTION

The invention relates to a semiconductor structures and methods of manufacture and, more particularly, a structure and method to control bottom corner threshold in a silicon-on-insulator (SOI) device.

BACKGROUND

A deep trench (DT) gating effect may exist in an array of eDRAM devices and is a prominent leakage mechanism that reduces the retention time of eDRAM devices. For example, in an array of eDRAM devices, each device may comprise a storage cell (e.g., a deep trench capacitor) and a gate (e.g., a FET). The storage cell of one device may electrically couple with the SOI island in which a FET of an adjacent device is formed. This capacitive coupling between the storage cell of one eDRAM and the SOI island of a FET of an adjacent eDRAM weakly turns on the surface at the back or bottom corner of the SOI island that the adjacent FET is formed on, which creates a leakage current in the adjacent FET. The leakage current causes the adjacent eDRAM to lose its charge, e.g., the information stored in its storage cell. Such leakage necessitates more frequent refreshing which is undesirable for a number of reasons, including the fact that more frequent refreshing consumes more power.

A technique for reducing DT gating is to increase the spacing between the storage cells and the gates of adjacent devices. However, increasing the spacing between devices goes against the constant drive in the industry for reducing the size of integrated circuits. Another way to address DT gating is by performing halo implants, through-gate implants, and/or well implants at the FET. However, such implant techniques result in doping the entire backside and/or entire sidewall of the SOI island in which the FET is formed, and such over-doping can negatively affect device performance in an undesired manner.

Accordingly, there exists a need in the art to overcome the deficiencies and limitations described hereinabove.

SUMMARY

In a first aspect of the invention, there is a method of fabricating a semiconductor structure. The method includes doping a corner region of a semiconductor-on-insulator (SOI) island. The doping includes tailoring a localized doping of the corner region to reduce capacitive coupling of the SOI island with an adjacent structure.

In another aspect of the invention, there is a method of fabricating a semiconductor device. The method includes: forming a trench in a semiconductor-on-insulator (SOI) wafer; exposing a surface of a corner region of an SOI island via the trench; and doping the corner region of the SOI island through the exposed surface.

In accordance with further aspects of the invention, there is a semiconductor device including: a substrate; a buried insulator layer on the substrate; and a semiconductor-on-insulator (SOI) island on the buried insulator layer. The semiconductor device also includes a structure in the buried insulator layer adjacent the SOI island, the structure being connected to a non-zero voltage during at least a portion of device operation. The semiconductor device also includes an isolation region between the SOI island and the structure, wherein one or more corner regions of the SOI island comprise a localized doping that reduces capacitive coupling between the SOI island and the structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a semiconductor structures and methods of manufacture and, more particularly, a structure and method to control bottom corner threshold in a silicon-on-insulator (SOI) device. In accordance with aspects of the invention, a localized doping is performed at the bottom corner of an SOI island associated with an eDRAM FET. In embodiments, the localized doping in the bottom corner of the SOI island reduces the gating effect by preventing the capacitive coupling between the SOI island and an adjacent eDRAM storage cell. Although the invention is described with respect to eDRAM devices, the structures and methods described herein may be used with other applications in which SOI bottom corner threshold control is desired.

Figure 1:
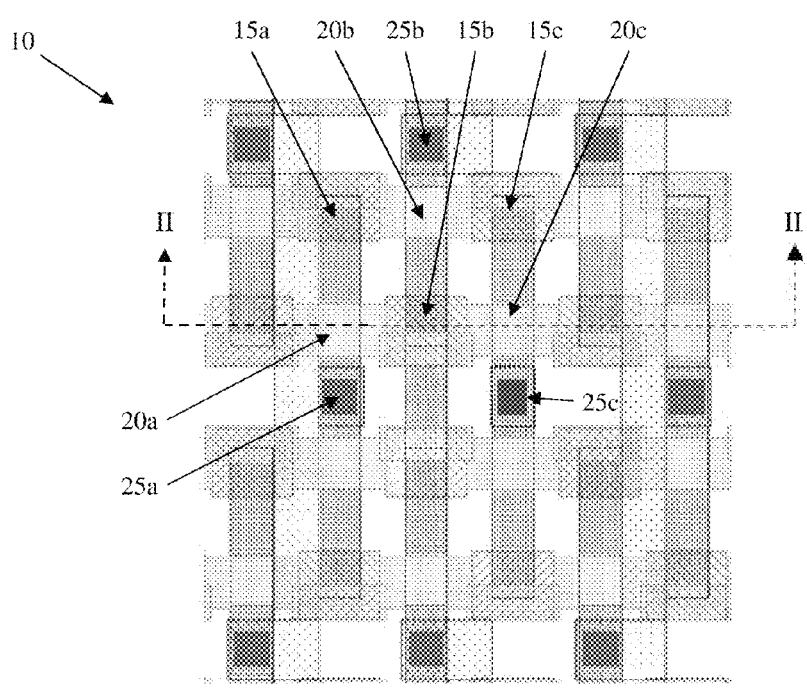
FIGS. 1 and 2 show structures associated with aspects of the invention.

FIG. 1 shows an array of eDRAM devices in accordance with aspects of the invention. Each individual device in the array may include, among other features, a storage cell, a gate, and a contact. For example, a first device may comprise a storage cell 15a, a gate 20a, and a contact 25a. A second device may comprise a storage cell 15b, a gate 20b, and a contact 25b. A third device may comprise a storage cell 15c, a gate 20c, and a contact 25c. Any number of devices may be used within the array 10, and the devices may be arranged in any desired pattern. For example, as depicted in FIG. 1, the device may be staggered in the array 10 such that the gates 20a and 20c of a first and third device are adjacent to the storage cell 15b of a second device.

Figure 2:
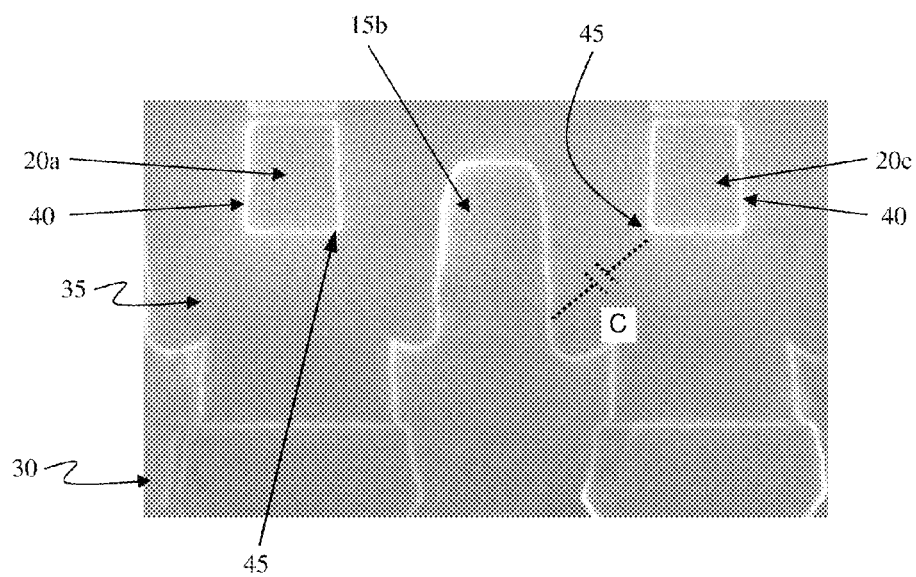

FIG. 2 shows a cross section of the wafer containing the array 10 taken along line II-II of FIG. 1. In embodiments, the wafer includes a substrate 30, a buried insulator layer 35 on the substrate 30, and SOI islands 40 formed in the insulator layer 35. As depicted in FIG. 2, the gates 20a and 20c of the first and third devices are formed in the SOI islands 40, which are in close proximity to the storage cell 15b of the second device.

In embodiments, the storage cell 15b comprises a deep trench (DT) capacitor that extends through the insulator layer 35 into the substrate 30. The elements depicted in FIG. 2 may be of any suitable size. For example, the storage cell 15b may comprise a width of about 160 nm to about 178 nm; however, the invention is not limited to these dimensions, and any suitable dimensions may be used within the scope of the invention. Moreover, the SOI islands 40 may have widths ranging from about 76 nm to about 86 nm; however, the invention is not limited to these dimensions, and any suitable dimensions may be used within the scope of the invention.

Due to the proximity of the storage cell 15b to bottom corners 45 of the SOI islands 40, there is the possibility of capacitive coupling between the storage cell 15b and the adjacent gates 20a and 20c. The potential for such capacitive coupling is diagrammatically represented by dashed-line element "C" in FIG. 2. In accordance with aspects of the invention, the bottom corners 45 of the SOI islands 40 are doped to prevent this capacitive coupling "C" and therefore to reduce or eliminate the gating effect. As described in greater detail herein, in embodiments the doping is performed in a localized manner at the corner 45, such that doping of entire sides of the SOI island 40 is avoided.

Figure 3:
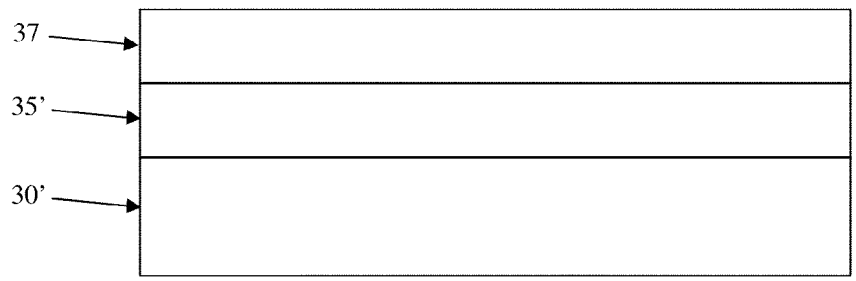
FIGS. 3-6 show processing steps and structures associated with aspects of the invention.

FIGS. 3-6 and 8-14 show processing steps and structures associated with forming a semiconductor device in accordance with aspects of the invention. Specifically, FIG. 3 shows an exemplary SOI wafer employed as an intermediate structure in implementations of the invention. The SOI wafer has a bulk semiconductor substrate 30', which is typically a silicon substrate, a buried insulator layer 35' formed on the substrate 30', and a semiconductor layer 37, which is typically a silicon layer, formed on the buried insulator layer 35'. The substrate 30' and buried insulator layer 35' may be similar to the substrate 30 and insulator layer 35, respectively, described above with respect to FIG. 2. The SOI wafer may be fabricated using techniques well know to those skilled in the art. For example, the SOI wafer may be formed by conventional processes including, but not limited to, oxygen implantation (e.g., SIMOX), wafer bonding (e.g., the "SMART CUT" method, which is a registered trademark of S.O.I.TEC Silicon On Insulator Technologies of Bernin, France), etc.

The constituent materials of the SOI wafer may be selected based on the desired end use application of the semiconductor device. For example, the substrate 30' may be composed of any suitable material including, but not limited to, Si, SiGe, SiGeC, SiC, GE alloys, GaAs, InAs, InP, and other III/V or II/VI compound semiconductors. The buried insulator layer 35' may be composed of oxide, such as $SiO_2$, and may be referred to as a buried oxide (BOX) layer 35'. Moreover, although the SOI wafer is referred to as "silicon on insulator," the semiconductor layer 37 is not limited to silicon. Instead, the semiconductor layer 37 may be comprised of various semiconductor materials, such as, for example, Si, SiGe, SiC, SiGeC, etc.

In embodiments, the SOI wafer has a thickness of about 700 μm, with the BOX layer 35' having a thickness of about 0.14 μm, and the semiconductor layer 37 having a thickness of about 0.08 μm. However, the invention is not limited to these dimensions, and the various portions of the SOI wafer may have any desired thicknesses based upon the intended use of the final semiconductor device.

Figure 4:
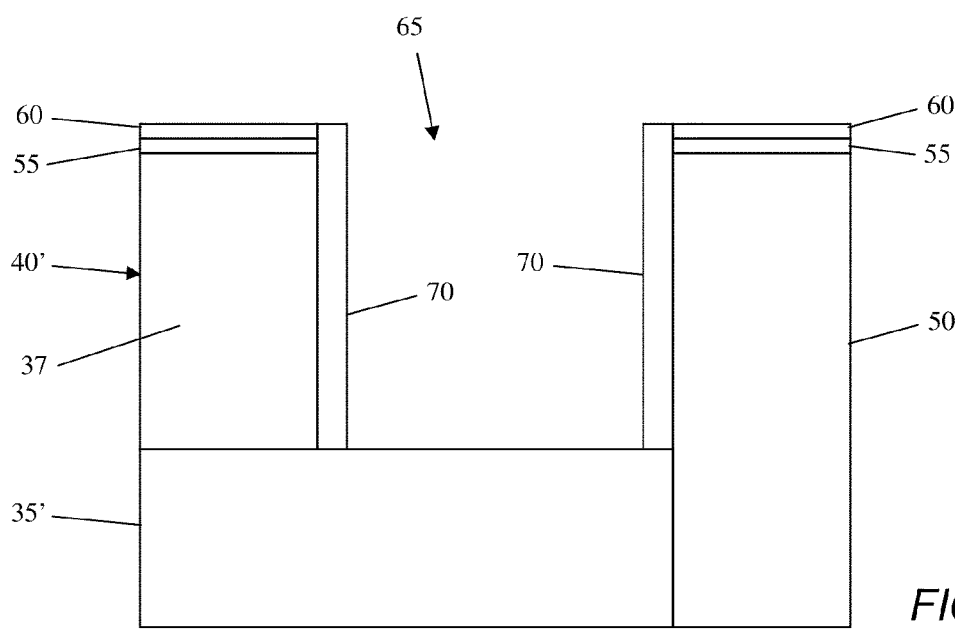

FIG. 4 shows a portion of the wafer after a number of conventional semiconductor fabrication processing steps have been performed, including: forming a deep trench capacitor 50 in the wafer; forming a layer of pad oxide 55 on the upper surface of the wafer; forming a layer of pad nitride 60 on the pad oxide 55; forming a trench 65 through the pad nitride 60, pad oxide 55, and semiconductor layer 37 down to the BOX layer 35'; and forming a liner 70 on the sidewalls of the trench 65 while leaving at least a portion of the upper surface of the BOX layer 35' exposed. Although the invention is described herein with reference to a deep trench capacitor 50, the invention is not limited to only a deep trench capacitor. Instead, element 50 may be any adjacent structure that is connected to some certain voltage during the device operation and generates coupling effects. For example, element 50 may comprise a deep trench capacitor, another FET, a buried conducting wire (e.g. wordline or bitline), etc.

In embodiments, the pad oxide 55 and pad nitride 60 may comprise any suitable oxide and nitride, respectively, such as $SiO_2$ and $Si_3N_4$, and may be formed using any desired fabrication technique, such as: thermal oxidation, chemical oxidation, thermal nitridation, atomic layer deposition (ALD), molecular layer deposition (MLD), chemical vapor deposition (CVD), low-pressure chemical vapor deposition (LPCVD), plasma enhanced chemical vapor deposition (PECVD), etc. It is understood that the BOX layer 35' and capacitor 50 are on the substrate 30'. Moreover, a liner may be formed around the capacitor 50.

In embodiments, the trench 65 may be formed using any suitable semiconductor fabrication techniques, including but not limited to: masking and etching, laser ablation, gas cluster ion beam, etc. In a particular embodiment, the trench 65 is formed by applying a patterned mask (not shown) on the structure and removing material of the pad nitride 60, pad oxide 55, and semiconductor layer 37 through the patterned mask via one or more etch processes. The mask may be composed of, for example, a photoresist material, a hard mask material, or any other suitable masking layer. In embodiments, the one or more etch processes are anisotropic so that the etching occurs in a substantially vertical direction. The trench 65 may have a depth of about 0.08 μm and a width of about 60 nm, although the invention is not limited to these values and any size trench may be used within the scope of the invention.

In accordance with aspects of the invention, the formation of the trench 65 creates an SOI island 40' from the material of the semiconductor layer 37. In embodiments, the SOI island 40' may be similar to that described above with respect to FIG. 2 and may be associated with a FET of an eDRAM device, or other integrated circuit (IC) device.

Still referring to FIG. 4, the liner 70 comprises a shallow trench isolation (STI) liner and is composed of nitride or another material that has a significantly slower etch rate compared to an etch rate of the BOX layer 35' during a subsequent etching step of the BOX layer 35', described in greater detail below. For example, the liner 70 may comprise a layer of $Si_3N_4$ and may be formed using any suitable fabrication process, such as those described above with respect to the pad oxide 55 and pad nitride 60. The liner 70 may be about 5 nm thick, although the invention is not limited to this value and any size liner may be used within the scope of the invention.

Figure 5:
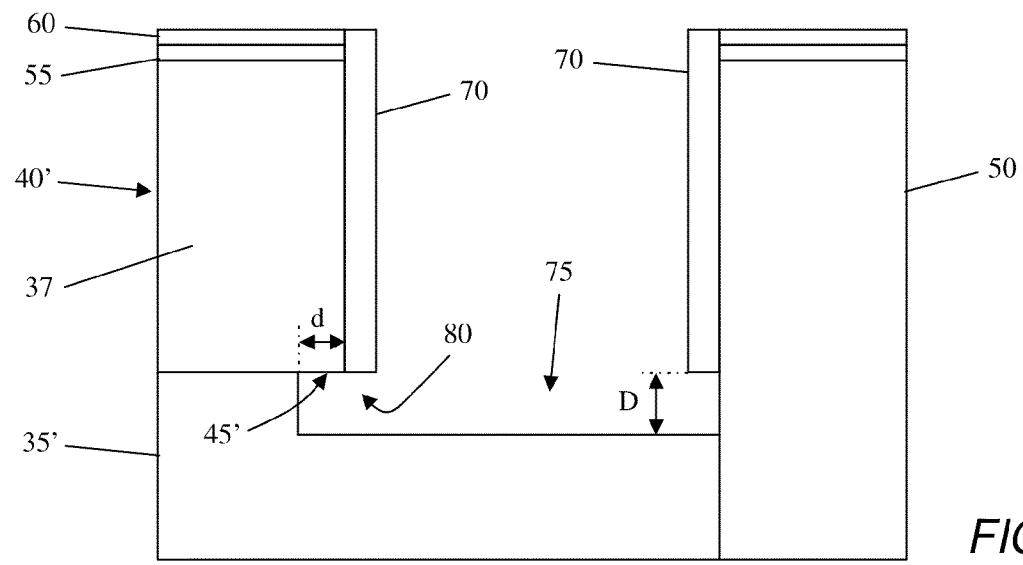

In accordance with aspects of the invention, FIG. 5 depicts etching an opening 75 in the BOX layer 35' through the trench 65 to form an undercut 80 under a corner 45' of the SOI island 40'. In embodiments, the etch process is selective to the material of the liner 70, the material of the semiconductor layer 37, and the material of the capacitor 50, such that the etch process removes material of the BOX layer 35' without removing substantially any material from the liner 70, the semiconductor layer 37, or the capacitor 50. In further embodiments, the etch process is isotropic so that it travels laterally from the bottom of the trench 65 to underneath the corner 45' of the SOI island 40'. For example, the etch process may comprise an oxide chemical etch that is isotropic and is highly selective of the BOX layer 35' relative to the nitride liner 70 and the silicon semiconductor layer 37; however, any suitable etch process may be used within the scope of the invention.

In embodiments, the opening 75 in the BOX layer 35' has a depth "D" of about 5 nm to about 10 nm, and the undercut 80 extends laterally underneath the corner 45' of the SOI island 40' by a dimension "d" of about 5 nm. The invention is not limited to these particular values for dimensions "D" and "d"; however, and any suitable values may be used within the scope of the invention. The dimensions "D" and "d" may be controlled by controlling the timing of the etch process of the BOX layer 35'.

Figure 6:
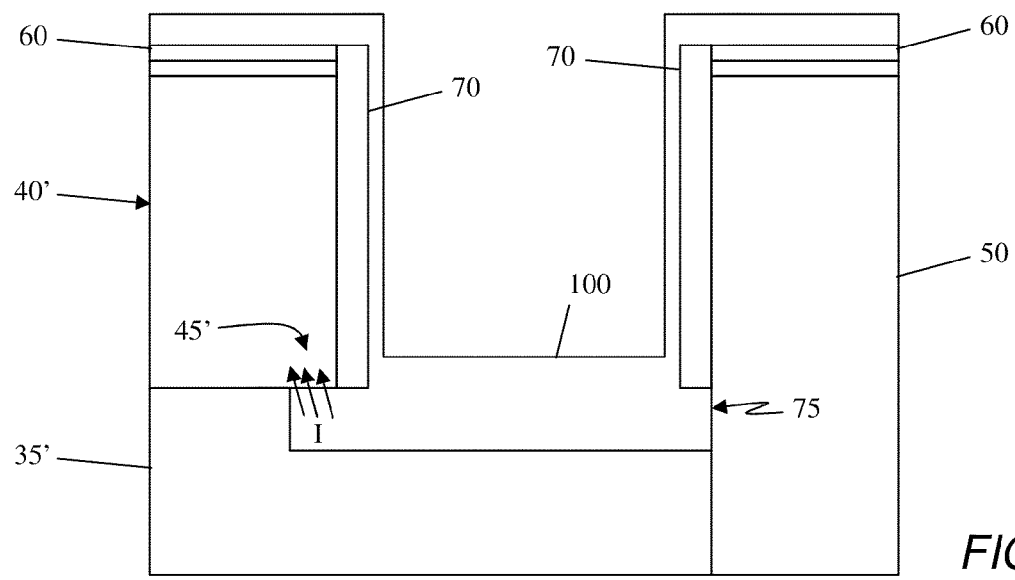

In accordance with aspects of the invention, and as depicted in FIG. 6, a source doping layer 100 is formed in the opening 75 in the BOX layer 35'. The material of the source doping layer 100 fills the opening 75 and contacts the underside of the corner 45' of the SOI island 40'. The source doping layer 100 may extend upward out of the opening 75, and may even be formed on the liner 70 and the pad nitride 60; however, such coverage is optional.

In embodiments, the source doping layer 100 is composed of a material comprising a p-type dopant, such as boron or any other suitable p-type dopant. For example, the source doping layer 100 may be composed of boron silicide, borosilicate glass (BSG), boron doped polysilicon, or other suitable materials. Although exemplary embodiments of the invention are described herein in terms of p-type dopants, the invention is not limited to use with p-type dopants. Instead, any suitable dopant, such as n-type dopants, may be used based on the desired application, e.g., based on the desired intended use of the structure being fabricated. In embodiments, the concentration of dopant in the source doping layer 100 is about 3e20 atoms/cm$^3$; however, the invention is not limited to this concentration, and any suitable concentration may be used within the scope of the invention. The source doping layer 100 may be formed using conventional fabrication processes, such as, but not limited to: ALD, MLD, CVD, LPCVD, PECVD, etc.

Still referring to FIG. 6, after forming the source doping layer 100, an thermal anneal process is performed to drive the dopant from the source doping layer 100 into the corner 45' of the SOI island 40'. In embodiments, the anneal process is a rapid thermal anneal (RTA) that is performed at about 1000° C. for about 5 seconds; however, the invention is not limited to these anneal parameters, and any suitable annealing may be performed. The anneal causes at least a portion of the p-type dopant ions that are present in the source doping layer 100 to migrate into the corner 45' of the SOI island 40' as represented by arrows "I" in FIG. 6.

Figure 7:
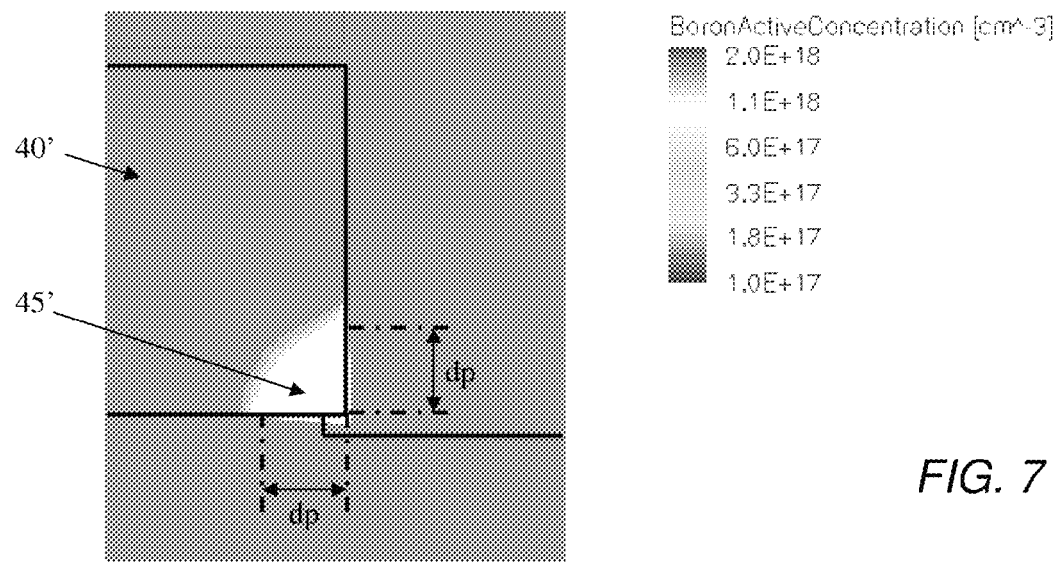
FIG. 7 shows corner doping concentrations associated with FIGS. 3-6 in accordance with aspects of the invention.

FIG. 7 shows simulation results of dopant density at the corner 45' of the SOI island 40'. For example, FIG. 7 depicts the doping distribution at the end of front end of line (FEOL) processes, which may include the RTA described above and other thermal steps. In embodiments, the doping of the corner 45' results in a doped area that extends a distance "dp" up the sidewall of the SOI island 40' from the bottom of the corner 45' and about the same distance "dp" along the bottom of the SOI island 40' from the apex of the corner 45'. In embodiments, the distance "dp" is about 5 nm and the doped area has a concentration of about 1e18 atoms/cm$^3$. The spatial extent and concentration of the doping in the corner 45' are not limited to these particular values, and any suitable doping of the corner 45' may be performed. It is noted, however, that the doping is confined to the corner 45' and does not extend into the remainder of the SOI island 40' and process parameters should be tailored to provide these characteristics.

For example, in the illustrative case shown in FIG. 7, the doping extends along less than one-third the length of the side and bottom surfaces of the SOI island 40'. In this manner, implementations of the invention provide the ability to dope only the corner region of the SOI island 40', without doping regions of the SOI island 40' beyond the corner. As such, the doping is said to be tailored and localized to the corner region of the SOI island. That is, implementations of the invention avoid doping the entire sidewall and/or the entire bottom surface of the SOI island 40'. This selective doping confines the dopant to the corner 45' and avoids negative effects that may occur as a result of over-doping the SOI island 40'. In this manner, implementations of the invention provide for tailoring a localized doping of the corner region 45', and this tailored doping produces the effect of reducing or preventing capacitive coupling between the SOI island 40' and an adjacent structure such as the capacitor 50.

Figure 8:
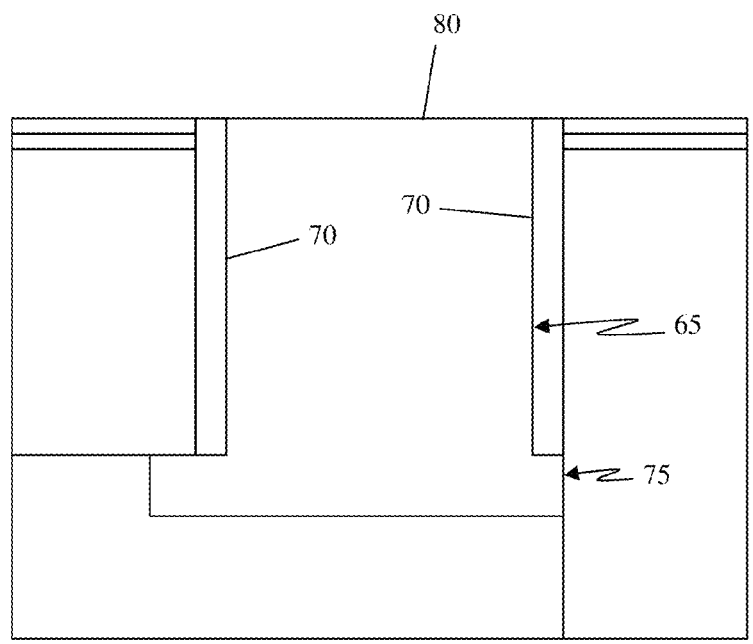
FIGS. 8-13 show processing steps and structures associated with aspects of the invention.

FIG. 8 shows the structure after doping the corner, removing the source doping layer 100, and filling the trench 65 with isolation material 80. In embodiments, the source doping layer 100 is removed from the opening 75 and the trench 65 using a chemical etch that has a high selectivity of the material of the source doping layer 100 relative to the surrounding materials. In this regard, the source doping layer 100 may be composed of 5% BSG, which may have an etch ratio of about 50:1 relative to oxide. In embodiments, after the source doping layer 100 is removed, the opening 75 and trench 65 are filled with isolation material 80, such as $SiO_2$, using conventional techniques, such as thermal oxidation, chemical oxidation, ALD, MLD, CVD, LPCVD, PECVD, etc. The liner 70 may or may not be removed or thinned using a reactive ion etch (RIE) process prior to filling the trench 65.

After removal of the source doping layer 100 and subsequently filling the trench 65, as depicted in FIG. 8, conventional processing steps may be performed. For example, an STI anneal may be performed, one or more FETs may be formed in the SOI island 40', wiring and interconnects may be formed, etc.

Alternatively to forming and annealing a source doping layer as described above with respect to FIG. 6, the corner 45' may be doped using a gas phase doping process. For example, beginning with the structure shown in FIG. 5, a process gas containing boron may be introduced at a predetermined pressure inside a vacuum chamber while heating the wafer, including SOI island 40' and corner 45', to a temperature higher than 600° C. In this manner, the process gas can be pyrolyzed to allow direct reaction of boron atoms or molecules containing boron with silicon atoms of the SOI island 40' to thereby form a boron-silicon compound at the corner 45'. In this manner, the exposed corner 45' can be doped with boron; however, the remainder of the SOI island 40' is not doped since it is covered and therefore not exposed to the process gas.

Figure 9:
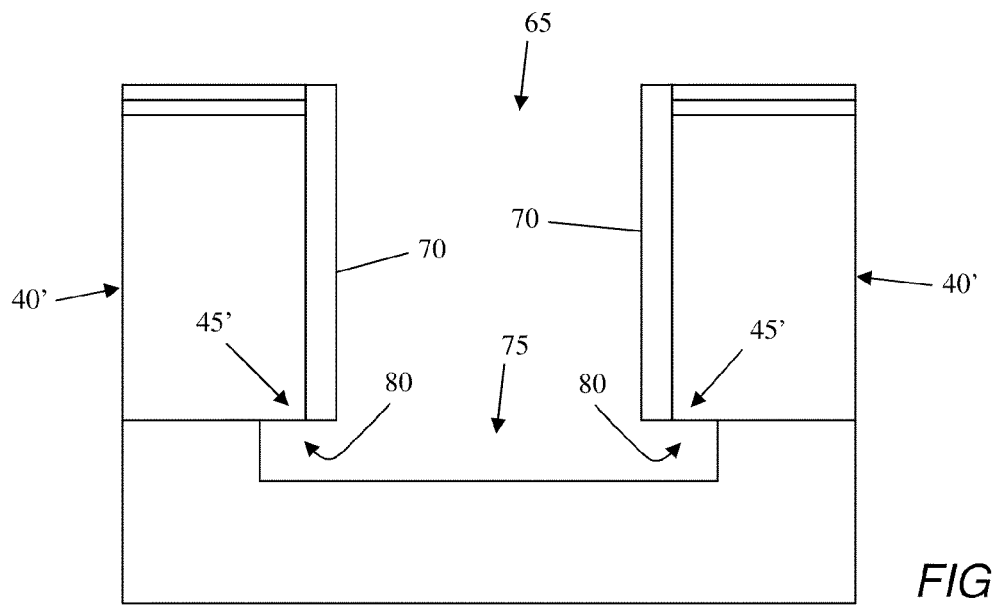

As described above with respect to FIGS. 4-8, the trench 65 may be formed between an SOI island 40' and a deep trench capacitor 50. FIG. 9 shows an alternative embodiment in which the STI trench 65 is formed between two SOI islands 40', rather than between one STI island 40' and a deep trench capacitor 50 as depicted in FIGS. 4-8. In the implementation shown in FIG. 9, the opening 75 formed in the BOX layer 35' extends under both SOI islands 40', such that a respective undercut 80 is formed under a respective corner 45' of each of the SOI islands 40'. In this manner, the respective corners 45' of two adjacent SOI islands 40' may be doped through a single trench 65 using a doping source layer (as described above with respect to FIG. 6) or by gas phase doping (as described above).

Alternatively to doping the corner of the SOI island prior to filling the trench 65 with STI material as described above with respect to FIGS. 4-9, other embodiments of the invention involve doping the corner of the SOI island after partially filling the trench 65. For example, an exemplary embodiment includes forming the trench 65, forming a layer of material in the trench 65, doping the layer of material, filling the trench with STI material, and using subsequent annealing steps to drive the dopant from the doped layer in the trench into the corner of the SOI island.

Figure 10:
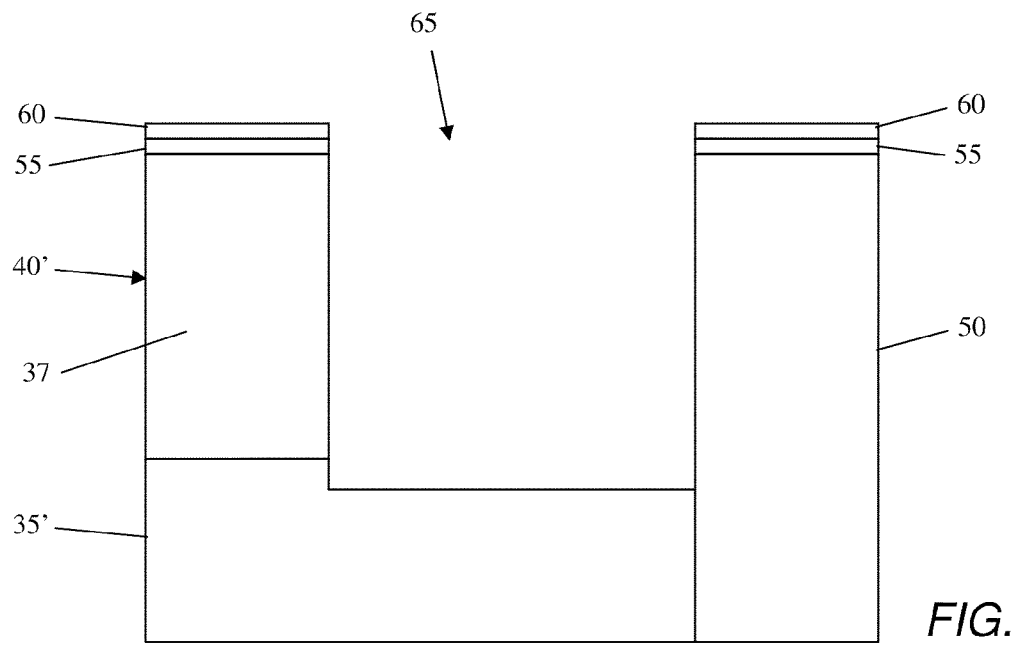

For example, FIG. 10 shows a wafer comprising a BOX layer 35', a semiconductor layer 37', a layer of pad oxide 55, a layer of pad nitride 60, a deep trench capacitor 50, and a trench 65. The features of the wafer in FIG. 10 may be similar to, and formed in a similar manner as, those described above with respect to FIGS. 3 and 4. In embodiments, the trench 65 extends to the upper surface of the BOX layer 35' or may optionally be over-etched into the BOX layer 35'.

Figure 11:
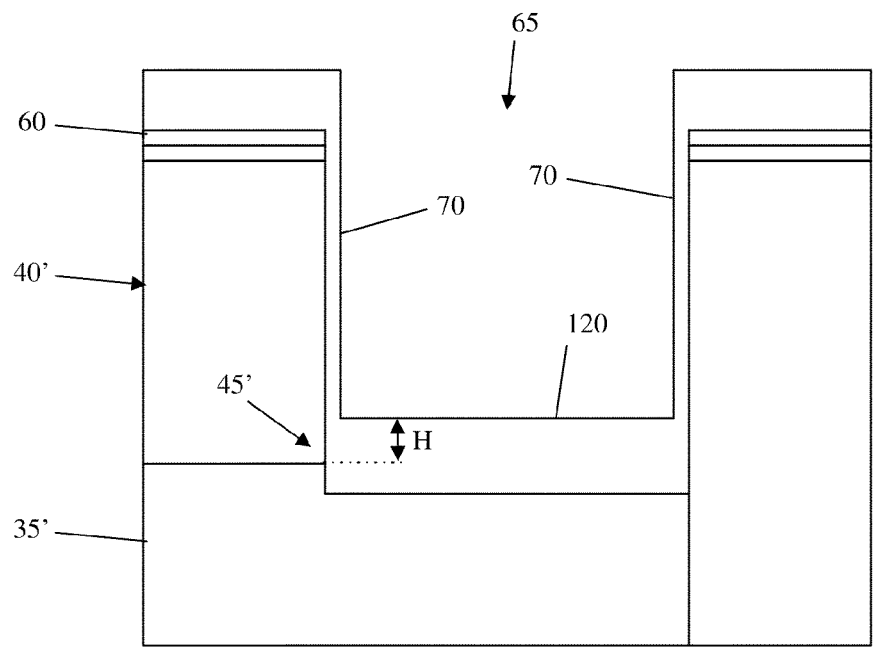

As depicted in FIG. 11, a layer of insulating material 120 is formed at the base of the trench 65 and in contact with the corner 45' of the SOI island 40'. The layer of insulating material 120 does not fill the trench 65, but rather only extends upward a height "H" above the interface between the BOX layer 35' and the SOI island 40'. In this manner, a portion of the layer of insulating material 120 directly contacts the corner 45' along the height "H". In embodiments, the height "H" is about 5 nm and corresponds to an extent of doping that will be applied to the corner 45' of the SOI island 40'.

As also shown in FIG. 11, a liner 70 is formed on the sidewalls of the trench 65. The liner 70 may be formed in the same process as the layer of insulating material 120, or may be formed in a different step. Also, the liner 70 may be composed of a same material as the layer of insulating material 120, or may be composed of a different material. In embodiments, both the liner 70 and the layer of insulating material 120 are composed of oxide, such as $SiO_2$, and are formed using suitable techniques such as thermal oxidation, chemical oxidation, ALD, MLD, CVD, LPCVD, PECVD, etc.; however, the invention is not limited to these materials, and any suitable STI materials may be used within the scope of the invention. As depicted in FIG. 10, the liner 70 and layer of insulating material 120 do not fill the trench 65.

Figure 12:
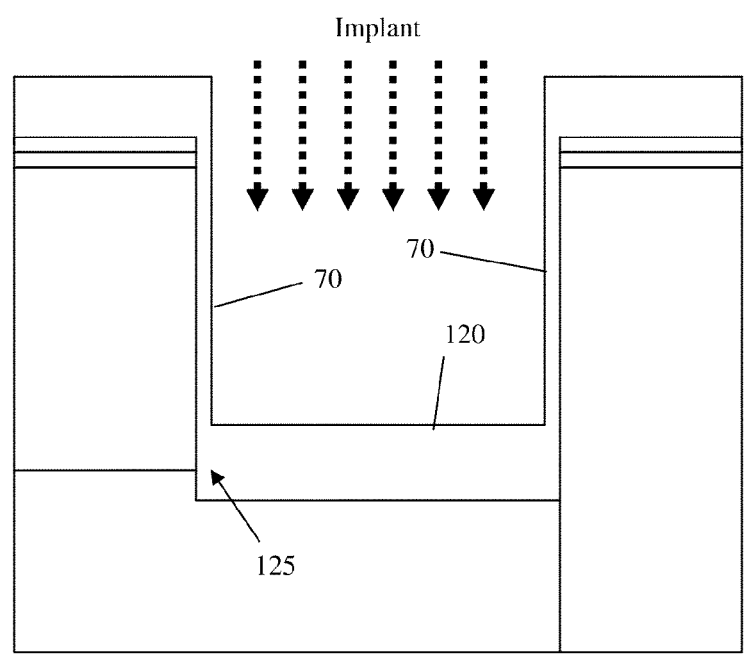

As depicted in FIG. 12, a dopant is implanted into the layer of insulating material 120. In embodiments, the dopant is a p-type dopant such as boron; however, any suitable p-type dopant may be used. In accordance with aspects of the invention, the doping of the layer of insulating material 120 is performed with a substantially vertical implant at an energy of about 0.7 keV, although any desired implant angle and energy may be used. The angle and energy of the implant cause the implanted ions to scatter laterally within the layer of insulating material 120, which results in the corner 125 of the layer of insulating material 120 having a much higher concentration of dopant than the liner 70.

Figure 13:
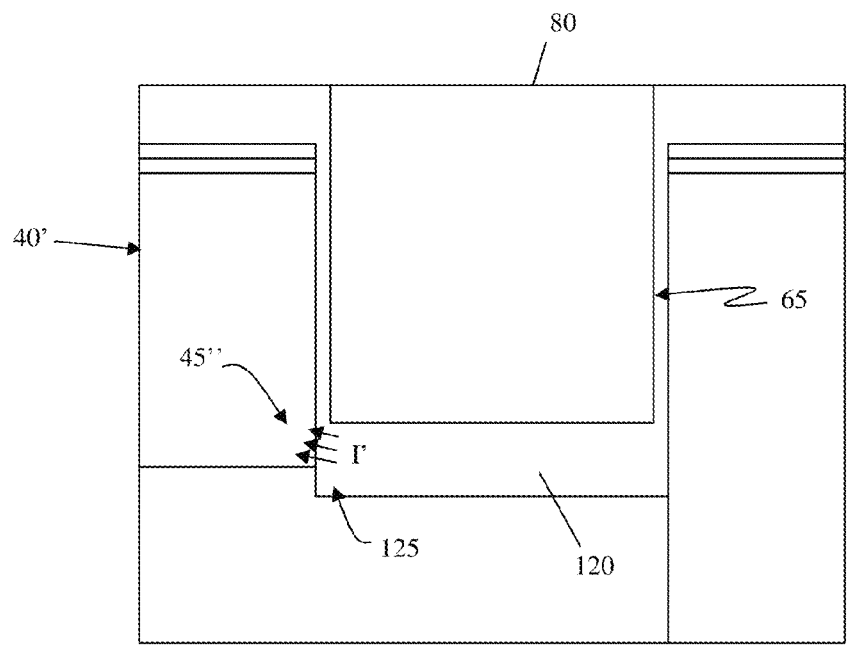

As shown in FIG. 13, the trench 65 is filled with an isolation material 80, which may include forming oxide such as $SiO_2$ in the trench using methods such as thermal oxidation, chemical oxidation, ALD, MLD, CVD, LPCVD, PECVD, etc. After the trench 65 is filled, chip fabrication may continue with known processes, such as an STI anneal, FET formation, silicide formation, forming wiring and interconnects, etc.

Still referring to FIG. 13, after the trench 65 is filled, thermal annealing steps involved in the subsequent processing steps drive the dopant from the corner 125 of the layer of insulating material 120 into the corner 45' of the SOI island 40'. For example, when an STI anneal is performed after filling the trench 65 with isolation material 80, the elevated temperature of the STI anneal causes at least a portion of the p-type ions to migrate from the corner 125 of the layer of insulating material 120 into the corner 45' of the SOI island 40', as depicted by arrows I'. Additionally or alternatively, when the structure is annealed to form silicide contacts on the FET, the elevated temperature of the silicide anneal causes the p-type ions to migrate from the corner 125 of the layer of insulating material 120 into the corner 45' of the SOI island 40'. Accordingly, in the embodiments shown in FIGS. 10-13, the doping of the corner 45' of the SOI island 40' occurs after the trench 65 is filled. Moreover, in the embodiment show in FIGS. 10-13, it is not necessary to perform an additional etch of the BOX layer to form undercuts under the SOI island.

Figure 14:
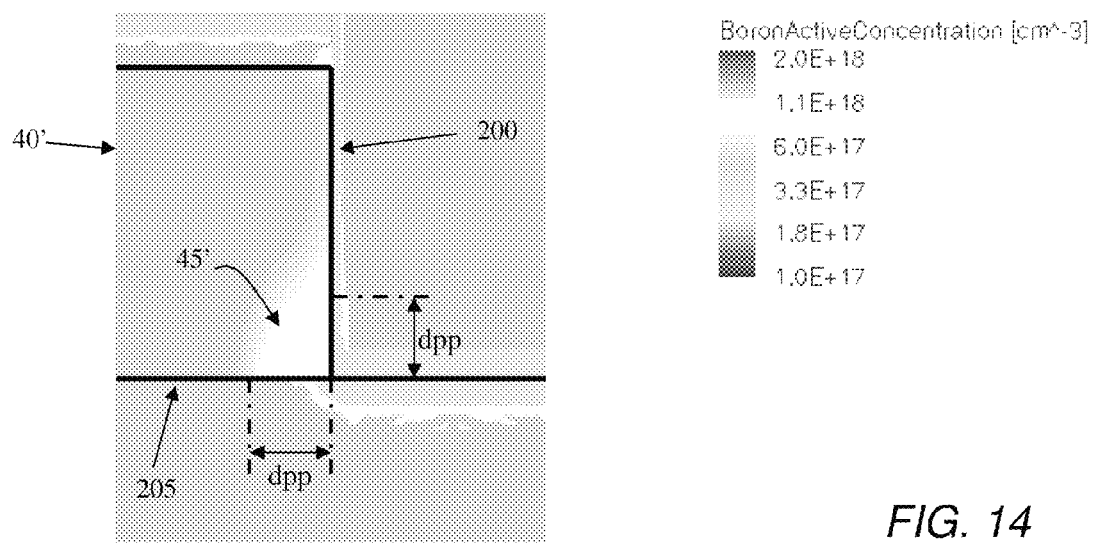
FIG. 14 shows corner doping concentrations associated with FIGS. 8-13 in accordance with aspects of the invention.

FIG. 14 shows simulation results of dopant density after the trench 65 is filled and a subsequent anneal process drives the dopant into the corner 45' of the SOI island 40'. In embodiments, the doping of the corner 45' results in a doped area that extends a distance "dpp" up the sidewall of the SOI island 40' from the vertex of the corner 45' and about the same distance "dpp" along the bottom surface of the SOI island 40' from the vertex of the corner 45'. In embodiments, the distance "dpp" is about 5 nm and the doped area has a concentration of about 1e18 atoms/cm$^3$. The spatial extent and concentration of the doping in the corner 45' are not limited to these particular values, and any suitable doping of the corner 45' may be performed to provide tailored doping characteristics. It is noted, however, that the doping is confined to the corner 45' and does not extend into the remainder of the SOI island 40'. This is due to the relatively high concentration of dopant in the corner 125 of the layer of insulating material 120 that contacts the corner 45' of the SOI island 40', and the relatively low concentration of dopant in the liner 70.

FIG. 14 depicts that a relatively low concentration of doping may occur along the length of the sidewall of the SOI island 40'. However, at regions 200 along the sidewall that are more than about one third the length of the sidewall away from a vertex of the corner 45, the doping concentration is significantly lower than the doping concentration in the region of the corner 45. For example, in embodiments, the doping concentration at the corner 45' is at least one full order of magnitude greater than the doping concentration at other locations 200 along the sidewall and locations 205 along the bottom surface of the SOI island 40'. As such, the doping is said to be tailored and localized to the corner region of the SOI island. In this manner, implementations of the invention provide a tailored and localized doping of the corner region 45', and this tailored doping produces the effect of reducing or preventing capacitive coupling between the SOI island 40' and an adjacent structure such as the capacitor 50.

Figure 15:
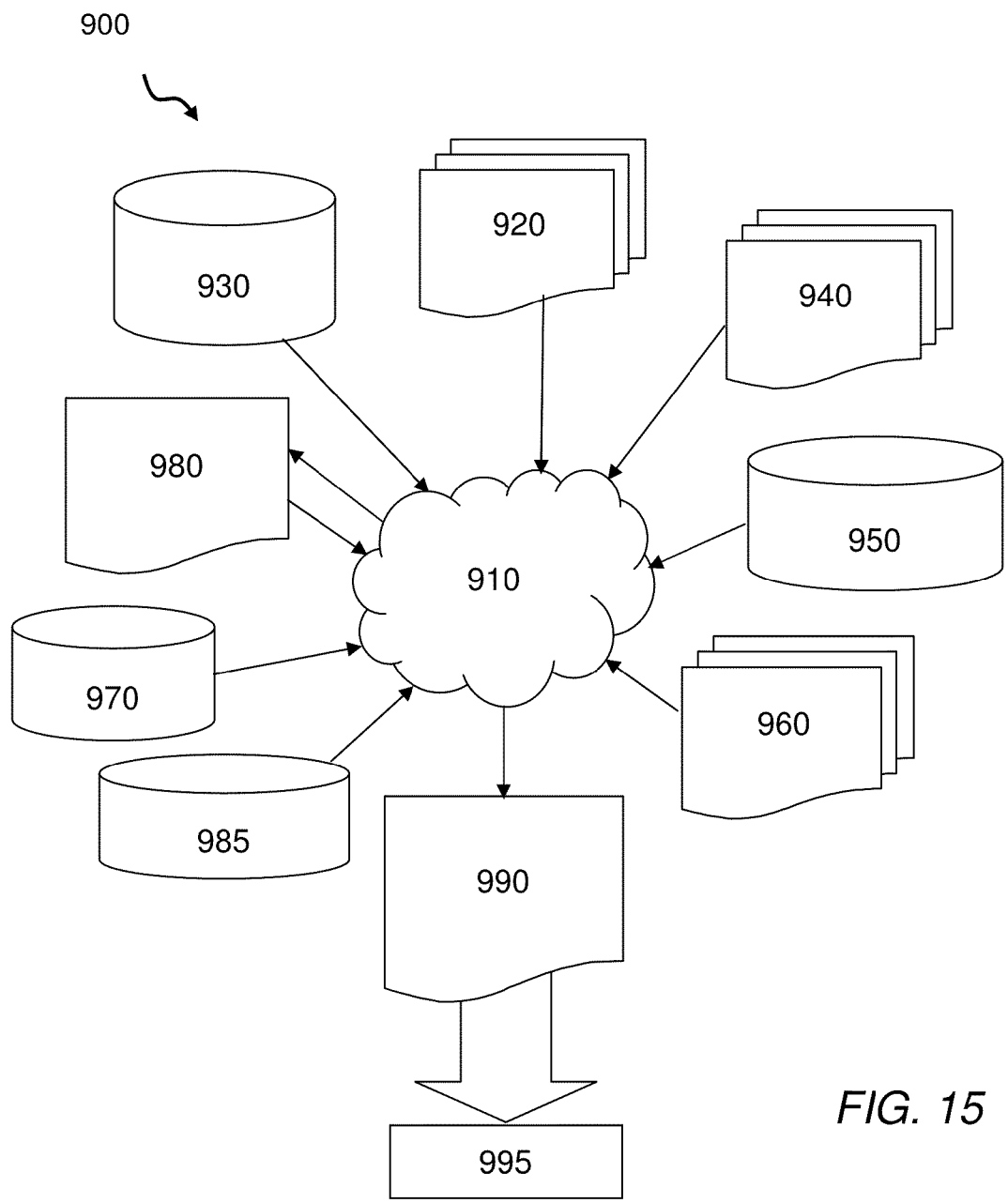
FIG. 15 is a flow diagram of a design process used in semiconductor design, manufacture, and/or test.

FIG. 15 is a flow diagram of a design process used in semiconductor design, manufacture, and/or test. FIG. 15 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6 and 8-13. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6 and 8-13. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 and 8-13 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6 and 8-13. In one embodiment, design structure 990 may comprise a compiled, executable HDL simulation model that functionally simulates the devices shown in FIGS. 1-6 and 8-13.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6 and 8-13. Design structure 990 may then proceed to a stage 995 where, for example, design structure 990: proceeds to tapeout, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of fabricating a semiconductor structure, comprising:
    doping a corner region of a semiconductor-on-insulator (SOI) island, wherein the doping comprises tailoring a localized doping of the corner region to reduce capacitive coupling of the SOI island with an adjacent structure;
    forming a trench adjacent the SOI island;
    forming a layer of insulating material in a bottom portion of the trench without filling an entirety of the trench; and
    implanting dopant ions into the layer of insulating material through an opening of the trench.

2. The method of claim 1, further comprising filling the trench with an isolation material, wherein the isolation material is on the layer of insulating material.

3. The method of claim 2, wherein the doping comprises thermally annealing the structure after the filling the trench with the isolation material, wherein the thermal annealing drives a portion of the dopant ions from the layer of insulating material into the lower corner region of the SOI island.

4. A method of fabricating a semiconductor device, comprising:
    forming a trench in a semiconductor-on-insulator (SOI) wafer;
    exposing a surface of a corner region of an SOI island via the trench; and
    doping the corner region of the SOI island through the exposed surface,
    wherein the doping comprises:
        forming a layer of insulating material in a bottom portion of the trench without filling an entirety of the trench;
        implanting dopant ions into the layer of insulating material through the trench;
        filling the trench with an isolation material, wherein the isolation material is on the layer of insulating material; and
        thermally annealing the structure after the filling the trench with the isolation material, wherein the thermal annealing drives a portion of the dopant ions from the layer of insulating material into the corner region of the SOI island.

5. A method of fabricating a semiconductor structure, comprising:
    doping a corner region of a semiconductor-on-insulator (SOI) island, wherein the doping comprises tailoring a localized doping of the corner region to reduce capacitive coupling of the SOI island with an adjacent structure,
    wherein the doping comprises:
        forming a trench adjacent the SOI island;
        forming an undercut that exposes a surface of the lower corner region;
        forming a layer of source doping material in the undercut; and
        thermally annealing the structure, wherein the thermal annealing drives dopant ions from the source doping material into the lower corner region,
    further comprising:
        removing the source doping material; and
        filling the trench with isolation material.

6. A method of fabricating a semiconductor device, comprising:
    forming a trench in a semiconductor-on-insulator (SOI) wafer;
    exposing a surface of a corner region of an SOI island via the trench;
    doping the corner region of the SOI island through the exposed surface;

forming a transistor in the SOI island, wherein the doping reduces leakage in the transistor by preventing capacitive coupling between the SOI island and an adjacent structure; and forming a liner on sidewalls of the trench while leaving a portion of an upper surface of a buried oxide layer exposed, and wherein the exposing the surface of the corner region of the SOI island via the trench comprises creating an undercut beneath the corner region and the liner by removing a portion of the buried oxide layer beneath the corner region and the liner.

* * * * *